United States Patent [19]

Narita et al.

[11] Patent Number: 4,733,087
[45] Date of Patent: Mar. 22, 1988

[54] ION BEAM TREATING APPARATUS

[75] Inventors: Masamichi Narita; Yoshio Miura; Hideaki Kikuchi, all of Hitachi, Japan

[73] Assignee: Hitachi, Ltd., Tokyo, Japan

[21] Appl. No.: 876,467

[22] Filed: Jun. 20, 1986

[30] Foreign Application Priority Data

Jul. 1, 1985 [JP] Japan ................................. 60-142471

[51] Int. Cl.⁴ ......................... G21K 5/08; G01F 21/00
[52] U.S. Cl. ................................ 250/442.1; 250/492.2
[58] Field of Search ............. 250/440.1, 442.1, 492.21, 250/398; 364/559; 269/55, 58

[56] References Cited

U.S. PATENT DOCUMENTS

| | | | |
|---|---|---|---|
| 3,240,934 | 3/1966 | Watanabe et al. | 250/442.1 |
| 3,435,210 | 3/1969 | Valdre | 250/442.1 |
| 3,629,577 | 12/1971 | Weber | 250/442.1 |
| 3,920,233 | 11/1975 | Stuckert | 250/442.1 |
| 4,128,765 | 12/1978 | Franks | 250/442.1 |
| 4,405,864 | 9/1983 | del Rio | 250/442.1 |
| 4,627,009 | 12/1986 | Holmes | 250/442.1 |

Primary Examiner—Bruce C. Anderson
Attorney, Agent, or Firm—Antonelli, Terry & Wands

[57] ABSTRACT

A tilting mechanism tilts the wafer holding portions for wafers in any direction with respect to the direction of ion beams emitted from an ion source. The tilting mechanism is comprised of a linking mechanism for transmitting the rotation of the receiving plates to the wafer holding portions, tilted links for tilting the wafer holding portions, and a shaft being coupled to the tilted links and moving in the rotary disc. The wafer holding portions provide spherical portions, and the spherical portions are inserted in the receiving plates. A pin of the preceiving plates is fitted into the groove of the wafer holding portion. The distances between the ion source and the respective wafers are maintained equal. The ion beam irradiates uniformly the respective wafers and treats uniformly the respective wafers.

9 Claims, 7 Drawing Figures

ION BEAM TREATING APPARATUS

BACKGROUND OF THE INVENTION

1. Field of the Invention

The present invention relates to an ion beam treating apparatus and more particularly, to an ion beam treating apparatus such as an ion beam milling apparatus, an ion beam sputtering apparatus, or an ion implanting apparatus, that is adapted to irradiating a work piece which is to be treated with an ion beam while rotating and revolving the work piece.

2. Description of the Prior Art

In a conventional ion beam treating apparatus such as an ion beam milling apparatus, in general, the irradiation surfaces of wafers on a rotary disc are tilted relative to the irradiating direction of the ion beam and are irradiated with the ion beam while rotating and revolving the rotary disc. In order to prevent adhesion of matter by sputtering or to remove adhesion of matter by sputtering, the wafers must be irradiated with the ion beam obliquely.

In the ion beam milling apparatus, the acceleration voltage with the ion beam is as low as several hundreds of volts to several thousands of volts and, hence, the ion beam is emitted over from the ion source with wide angle of divergence. Since the rotary disc which consists of a linear flat type disc is provided in a tilted manner, the respective irradiation surfaces of wafers on the rotary disc maintain different distances with respect to the ion source.

The above-mentioned type of the ion beam milling apparatus has been disclosed in, for example, a journal "IONICS, Hardware in the Ion Beam Etching Technology", August, 1981.

According to the conventional ion beam milling apparatus, a rotary disc is disposed in a tilted manner in a vacuum vessel, and a shaft is formed together with the rotary disc as an unitary structure to transmit the rotational force thereto. On the rotary disc are arranged a plurality of wafer holding portions to hold the wafers that are to be treated. The wafers on the wafer holding portions are irradiated with the ion beam emitted from an ion source while rotating the shaft and the rotary disc.

With the conventional ion beam milling apparatus of the type in which the rotary disc is rotated and revolved in a tilted manner, however, the respective wafers on the wafer holding portions of the rotary disc are irradiated with the ion beam maintaining distances relative to the ion source, the distances being different by an angle of tilt of the rotary disc. Namely, the respective wafers on the wafer holding portions are not uniformly treated by the ion beam because the different distances between the ion source and the respective wafers to be treated. The each of the wafers do not be irradiated with the ion beam maintaining the uniform intensity.

Furthermore, when an ion source with a large diameter is used so that an increased number of wafers can be treated at one time, differences of the respective wafers further increase in the distances relative to the ion source. Therefore, it becomes more difficult to uniformly treat the respective wafers, presenting serious bottleneck for finely patterning the thin films for semiconductors.

SUMMARY OF THE INVENTION

An object of the present invention is to provide an ion beam treating apparatus which is capable of uniformly irradiating the work pieces with the ion beam to uniformly treat the work pieces.

Another object of the present invention is provide an ion beam treating apparatus wherein fine patterns on the work pieces can be obtained maintaining high precision.

In accordance with the present invention an ion beam treating apparatus comprising: a vacuum vessel; a plurality of work piece holding portions for holding the work pieces that are to be treated in the vacuum vessel; rotary receiving plates on which the work piece holding portions are mounted; a rotary disc for rotating the rotary receiving plates; a driving device for driving the rotary disc; and a tilting mechanism for tilting the work piece holding portions in any direction with respect to the direction of ion beam emitted from an ion source; wherein the tilting mechanism maintains equal the distances between the ion source and the respective work pieces to be treated, and each of the work pieces are irradiated with the ion beam maintaining the uniform intensity.

For those purposes the tilting mechanism is comprised of a linking mechanism for transmitting the rotation of the rotary receiving plate to the work piece holding portions, tilted links for tilting the work piece holding portions, a shaft being coupled to the tilted links and moving in the rotary disc, and moving means for moving the shaft, so that the distances are maintained equal between the ion source and the respective work pieces to be treated.

According to the present invention, the respective or individual work pieces are tilted, and are rotated and revolved maintaining the thus tilted angle. The tilting mechanism for tilting the work piece holding portions maintains equal the distances between the ion source and the respective work pieces to be treated.

Therefore, the surfaces of the respective work pieces are irradiated with the ion beam maintaining the uniform intensity, making it possible to prevent adhesion of matter by sputtering and to prevent the affect of the secondary sputtering among the work pieces. Accordingly, thin films for semiconductors can be finely patterned maintaining high precision.

DETAILED DESCRIPTION OF THE PREFERRED EMBODIMENT

Figure 1:
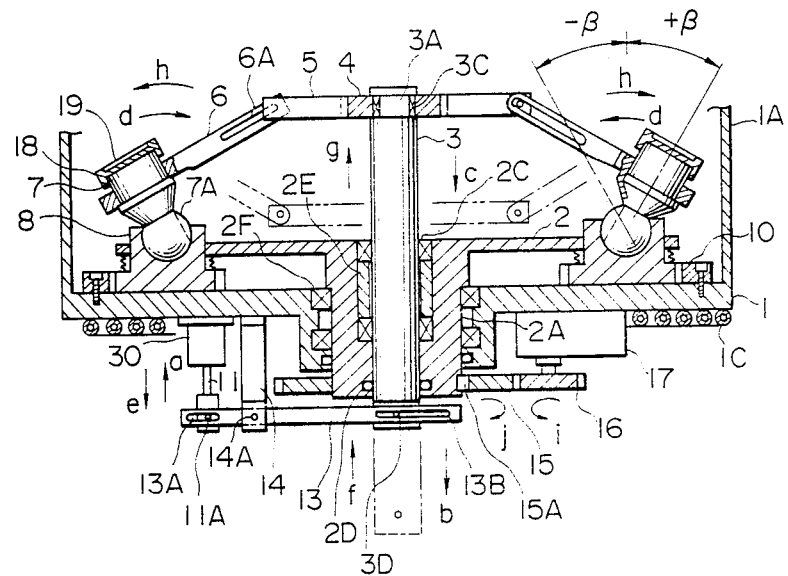
FIG. 1 is a sectional view showing an ion beam milling apparatus according to one embodiment of the present invention.
Figure 2:
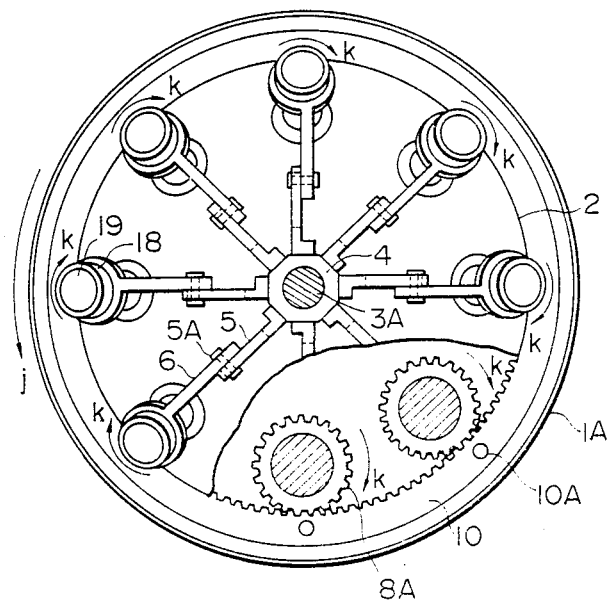
FIG. 2 is a plan view of FIG. 1 showing partly in cross section thereof.

FIGS. 1 and 2 illustrate in detail the structure of an ion beam milling apparatus which is an ion beam treating apparatus according to one embodiment of the present invention.

In the ion beam milling apparatus as shown in FIG. 1, an internal gear 10 and a plurality of rotary receiving plates 8 are provided on the bottom surface inside an inner wall 1A of a vacuum vessel 1 of the ion beam milling apparatus. Cooling pipes 1C are provided under the bottom surface outside the vacuum vessel 1. The internal gear 10 is secured by bolts 10A to the bottom surface inside the vacuum vessel 1. The internal gear 10 assumes the form of a cylindrical ring and has teeth formed on the inside thereof.

A gear 8A is formed along the periphery of each rotary receiving plates 8 and is engaged with the internal gear 10. A spherical hole is formed in the upper portion of the rotary receiving plate 8. A wafer holding portion 7 is provided having at its lower end a spherical portion 7A and holding a wafer 19 at the upper end thereof. The spherical portion 7A is inserted in the spherical hole of the rotary receiving plate 8. The wafer 19 is mounted by a cover 18 on the wafer holding portion 7 which is supported by a tilted link 6.

As shown in FIG. 2, the tilted links 6 are coupled by a pin 5A to the stays 5 that are radially fastened to a polygonal plate 4, through an oblong hole 6A formed in the tilted link 6. The polygonal plate 4 is mounted on an upper end 3A of a stepped shaft 3 via bearing means 3C and is allowed to rotate with respect to the stepped shaft 3. The stepped shaft 3 can be slidden up and down owing to bearing means 2C by an actuator 30.

An upper end of a shaft 11 of the actuator 30 such as an air cylinder secured to the lower portion outside the vacuum vessel 1 is coupled to a lower end of the stepped shaft 3 through a horizontal link 13 using a pin 11A of the shaft 11 and a pin 3D of the stepped shaft 3. A stay 14 is attached to a lower portion outside the vacuum vessel 1 on the inside of the air cylinder 30. Oblong holes 13A and 13B are formed respectively in the right and left sides of the link 13 with a pin 14A of the stay 14 as a fulcrum. The pin 11A of the shaft 11 is inserted in the oblong hole 13A formed in the horizontal link 13, and the pin 3D of the stepped shaft 3 is inserted in the oblong hole 13B of the horizontal link 13.

Figure 3:
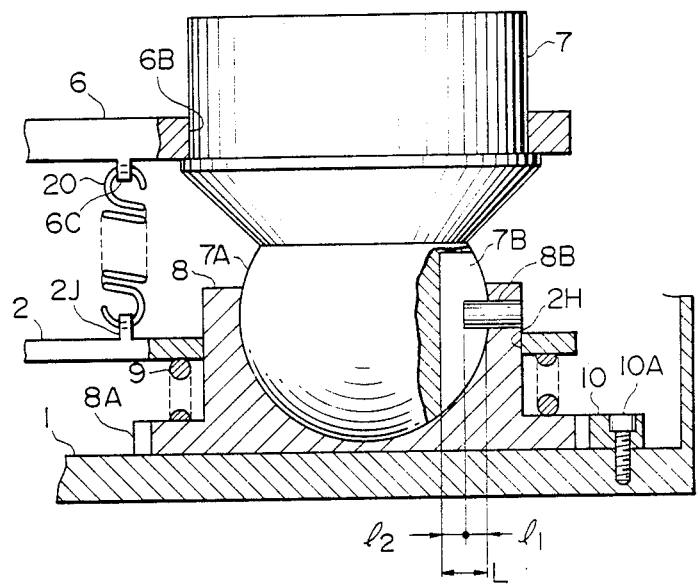
FIG. 3 is a diagram showing in detail and partly in cross section a wafer holding portion.

The rotary receiving plate 8 is supported, as shown in FIG. 3, by a hole 2H formed in a rotary disc 2. A compression spring means 9 is interposed between the rotary disc 2 and the rotary receiving plate 8 so that the rotary receiving plate 8 is pressed onto the bottom surface of the vacuum vessel 1. The rotary disc 2 having a boss 2A with a small diameter is allowed to rotate relative to the stepped shaft 3 owing to the bearing means 2C. The rotary disc 2 is further allowed to rotate relative to the vacuum vessel 1 owing to the bearing means 2F.

Moreover, an O-ring 2D and a collar 2E is provided respectively between the stepped shaft 3 and the rotary disc 2. Owing to a gear 15 attached to the stepped shaft 3 and a gear 16 attached to the end of shaft of a motor 17, the rotary disc 2 transmits the rotation of the motor 17 to the tilted link 6 to turn the polygonal plate 4. The gear 15 is mounted on the outerface of the rotary disc 2 through a key 15A.

As shown in FIG. 3, the tilted link 6 and the wafer holding portion 7 are combined together through a hole 6B formed in the tilted link 6. A projection 6C of the tilted link 6 and a projection 2J of the rotary disc 2 are coupled together by pulling spring means 20 to prevent the wafer holding portion 7 from floating when it is tilted. The wafer holding portion 7 and the rotary receiving plate 8 are contacted to each other along a spherical portion 7A. The spherical portion 7A is formed together with the wafer holding portion 7 at lower end thereof.

Figure 4:
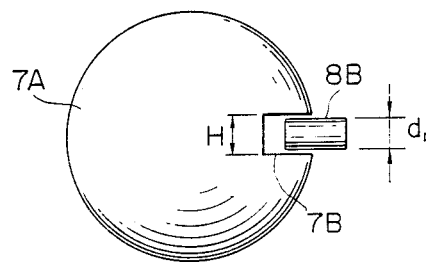
FIG. 4 is a side view of a spherical portion of the wafer holding portion.

In the spherical portion 7A of the wafer holding portion 7 is formed a groove 7B of a width H as shown in FIG. 4. A pin 8B with an outer diameter $d_1$ fastened to the rotary receiving plate 8 is fitted into the groove 7B. The width H of the groove 7B is slightly greater than the outer diameter $d_1$ of the pin 8B of the rotary receiving plate 8, so that the pin 8B of the rotary receiving plate 8 is allowed to slide in the groove 7B of the spherical portion 7A. The pin 8B is inserted by a depth $l_1$ in the groove 7B which has an maximum depth L; i.e., the pin 8B is floated by $l_2$.

A tilting mechanism of this embodiment of the present invention is comprised of the connecting mechanism for transmitting the rotation of the rotary receiving plate 8 to the wafer holding portions 7, tilted links 6 for tilting the wafer holding portions 7, the polygonal plate 4 for coupling the tilted links 6, the shaft 3 being coupled to the tilted links 6 as an unitary structure and moving in the rotary disc 2, and moving means for moving the shaft 3, so that the distances are maintained equal between an ion source and the respective wafers 19.

Namely, the respective wafers 19 on the wafer holding portions 7 are disposed on same circle line surrounding of the outersurface of the stepped shaft 3. The distances between the ion source and the respective wafers 19 are maintained equal. Accordingly, the ion beam emitted from the ion source irradiates uniformly the respective wafers 19 and treats uniformly the respective wafers 19. The respective wafers 19 are irradiated with the ion beam maintaining the uniform intensity.

Operation of the above embodiment of the present invention will now be described. As shown in FIG. 1, first, if the actuator 30 moves in a direction e, the stepped shaft 3 is moved in a direction f, whereby the polygonal plate 4 moves in a direction g and the wafer holding portions 7 are outwardly tilted in a direction h due to the tilted link 6. Conversely, if the actuator 30 is moved in a direction a, the stepped shaft 3 moves in a direction b and the polygonal plate 4 moves in a direction c to assume the state indicated by a two-dot chain line, whereby the wafer holding portions 7 are inwardly tilted in a direction d due to the tilted link 6.

When the turn in a direction i of the gear 16 produced by the motor 17 is transmitted to the rotary disc 2 via the gear 15, the rotary receiving plates 8 revolves in a direction j with the stepped shaft 3 as a center. At the same time, the rotary receiving plates 8 rotate in a direction k while revolving in the direction j, since they are in mesh with the internal gear 10 that is secured to the vacuum vessel 1.

A relationship between the rotary receiving plates 8 and the wafer holding portions 7, when the abovementioned operation is being carried out, will be explained below in conjunction with FIGS. 5, 6 and 7.

Figure 5:
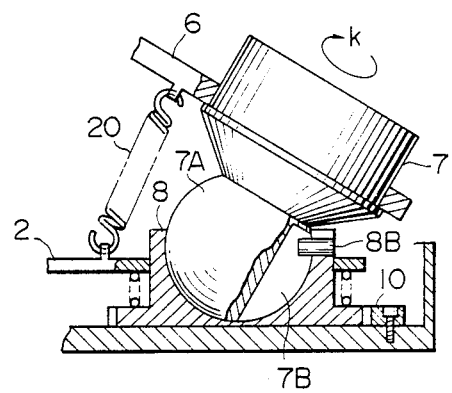
FIG. 5 is a diagram showing partly in cross section the state where the wafer holding portion is tilted.

FIG. 5 illustrates the state where the wafer holding portions 7 are outwardly tilted and the grooves 7B of the spherical portions 7A are located on the outermost side. Due to the rotary disc 2, the rotary receiving plates 8 starts to rotate from this position, and the wafer holding portions 7 and the rotary receiving plates 8 rotate in synchronism due to the pin 8B of the rotary receiving plates 8. Namely, the wafer holding portions 7 starts to rotate in the direction k.

Figure 6:
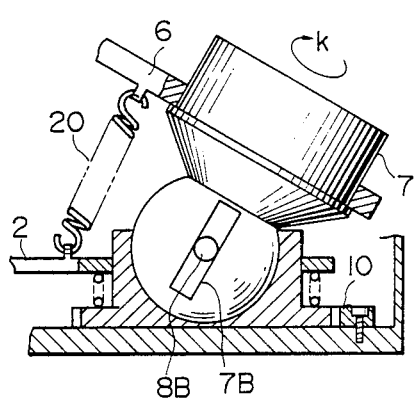
FIG. 6 is a diagram showing partly in cross section the state that is rotated by 90 degrees from the state of FIG. 5.
Figure 7:
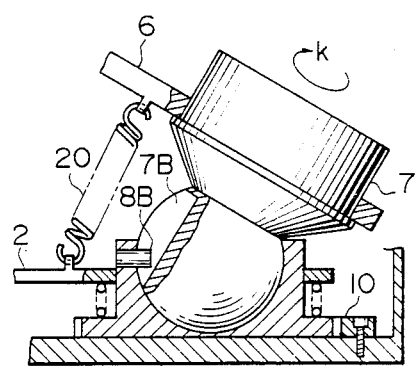
FIG. 7 is a diagram showing partly in cross section the state that is rotated by 180 degrees from the state of FIG. 5.

FIG. 6 illustrates the state where the rotary receiving plates 8 are rotated by 90 degrees from the state of FIG. 5, and FIG. 7 illustrates the state where the rotary receiving plates 8 are further rotated by 180 degrees from the state shown in FIG. 5.

Thus, the wafer holding portions 7 are allowed to rotate and revolve in the vacuum vessel 1 being tilted in any direction. As shown in FIG. 1, the wafer holding portions 7 can be maintained at any angle within a range of $\pm\beta$ degrees (usually $\pm 30$ degrees).

According to this embodiment of the present invention, therefore, the respective or individual wafers are tilted, and are rotated and revolved maintaining the thus tilted angle. The distances between the respective wafers on the wafer holding portions and the ion source are maintained equal by the tilting mechanism. Therefore, the surfaces of the respective or individual wafer are irradiated with the ion beam maintaining the uniform intensity, making it possible to prevent adhesion of matter by sputtering and to prevent the affect of the secondary sputtering among the respective wafers. Accordingly, thin films for semiconductors can be finely patterned maintaining high precision.

We claim:

1. An ion beam treating apparatus comprising: a vacuum vessel; a plurality of work piece holding portions for holding work pieces that are to be treated in said vacuum vessel; rotary receiving plates on which said work piece holding portions are mounted; a rotary disc for rotating said rotary receiving plates; a driving device for driving said rotary disk; and a tilting mechanism for tilting said work piece holding portions in any direction with respect to the direction of ion beam emitted from an ion source;

wherein said tilting mechanism is comprised of a linking mechanism for transmitting the rotation of said rotary receiving plates to said work piece holding portions, titled links for tilting said work piece holding portions, a shaft being coupled to said tilted links and mounted for axial movement in said rotary disk at the center thereof, and moving means for moving said shaft, so that distances are maintained equal between the ion source and the work pieces to be treated, and each of the work pieces are irradiated with the ion beam with a uniform intensity.

2. An ion beam treating apparatus according to claim 1, wherein said work piece holding portions provide spherical portions at low ends thereof, and said spherical portions of said work piece holding portions are inserted in said rotary receiving plates.

3. An ion beam treating apparatus according to claim 2, wherein a groove is formed in the spherical portion of said work piece holding portions, a pin is provided to said rotary receiving plates, and said pin of said rotary receiving plates is fitted into said groove of said work piece holding portion.

4. An ion beam treating apparatus according to claim 1, wherein an internal gear is secured to the inner bottom surface of said vacuum vessel, and said internal gear assumes the form of a cylindrical ring and has teeth formed on the inside thereof.

5. An ion beam treating apparatus according to claim 2, wherein each of said rotary receiving plates has a gear that meshes with said internal gear and further has a spherical hole with which is engaged each of said spherical portions of said work piece holding portions.

6. An ion beam treating apparatus according to claim 1, wherein said tilting mechanism is further comprised of a plate mounted on said shaft, and said plate is slidably coupled to said tilted links.

7. An ion beam treating apparatus according to claim 6, wherein said tilted links have oblong holes formed therein on a side opposite to the side where said work piece holding portions are supported, said plate being fastened to radial stays, and said radial stays are slideably coupled by a pin in said oblong holes of said tilted links.

8. An ion beam treating apparatus according to claim 6, wherein said plate is mounted via bearing means on an end of said shaft so as to rotate with respect to said shaft, and said shaft is slideable up and down in response to an actuator that is secured on the outside of said vacuum vessel.

9. An ion beam treating apparatus according to claim 8, wherein said work piece holding portions are disposed on a common circle line surrounding said shaft.

* * * * *